United States Patent
Tsai

(10) Patent No.: US 10,341,148 B2
(45) Date of Patent: Jul. 2, 2019

(54) SIGMA-DELTA MODULATOR AND ASSOCIATED SYSTEM IMPROVING SPECTRUM EFFICIENCY OF WIRED INTERCONNECTION

(71) Applicant: MEDIATEK Inc., Hsin-Chu (TW)

(72) Inventor: Jen-Huan Tsai, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/044,749

(22) Filed: Jul. 25, 2018

(65) Prior Publication Data

US 2019/0068415 A1     Feb. 28, 2019

Related U.S. Application Data

(60) Provisional application No. 62/550,040, filed on Aug. 25, 2017.

(51) Int. Cl.
| | |
|---|---|
| *H03M 1/12* | (2006.01) |
| *H03M 3/00* | (2006.01) |
| *H04L 25/49* | (2006.01) |
| *H04B 14/06* | (2006.01) |

(52) U.S. Cl.
CPC .......... *H04L 25/4902* (2013.01); *H03M 1/12* (2013.01); *H03M 3/456* (2013.01); *H03M 3/458* (2013.01); *H03M 3/504* (2013.01); *H04B 14/062* (2013.01)

(58) Field of Classification Search
CPC ... H04L 25/4902; H03M 3/504; H03M 3/458; H03M 1/12
USPC ........................................................ 341/143
See application file for complete search history.

(56) References Cited

U.S. PATENT DOCUMENTS

| | | | |
|---|---|---|---|
| 6,642,874 B1 * | 11/2003 | Lin | H03M 7/3008 341/143 |
| 8,421,661 B1 * | 4/2013 | Jee | G04F 10/005 341/143 |
| 9,742,428 B2 * | 8/2017 | Choi | H03M 3/422 |
| 10,084,474 B1 * | 9/2018 | Wang | H03M 3/50 |
| 2011/0175762 A1 | 7/2011 | Chae et al. | |

OTHER PUBLICATIONS

He, et al.: "Dual-band Transmitters Based on Lowpass and Bandpass Delta-Sigma Modulators"; Copyright 2016 IEEE; pp. 1-3.
EP Search Report dated Feb. 21, 2019 in EP application (No. 18187020.5-1203).

* cited by examiner

*Primary Examiner* — Brian K Young
(74) *Attorney, Agent, or Firm* — McClure, Qualey & Rodack, LLP

(57) ABSTRACT

The invention provides a sigma-delta modulator (SDM) and associated system improving spectrum efficiency of wired interconnection. The SDM may comprise a main circuit for transferring an aggregated signal by a signal transfer function, and a noise shaping circuit for shaping noise away from a low-pass band by a modified noise transfer function. A frequency response of the modified noise transfer function may have a notch at a passband, and the passband may not overlap with the low-pass band.

19 Claims, 5 Drawing Sheets

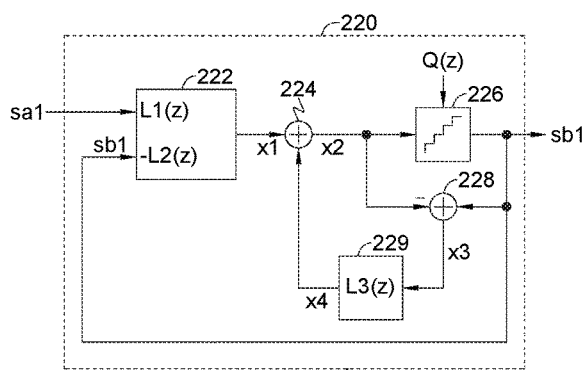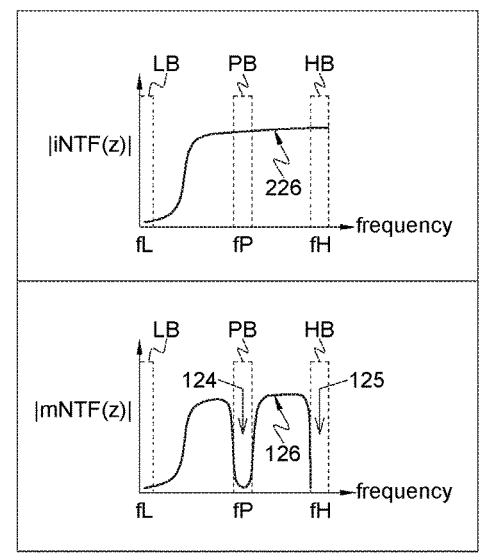
FIG. 4
FIG. 5

US 10,341,148 B2

SIGMA-DELTA MODULATOR AND ASSOCIATED SYSTEM IMPROVING SPECTRUM EFFICIENCY OF WIRED INTERCONNECTION

This application claims the benefit of U.S. provisional application Ser. No. 62/550,040, filed Aug. 25, 2017, the subject matter of which is incorporated herein by reference.

FIELD OF THE INVENTION

The present invention relates to sigma-delta modulator (SDM) and associated system improving spectrum efficiency of wired interconnection, and more particularly, to SDM and associated system improving spectrum efficiency by shaping noise with a modified noise transfer function having a frequency-domain notch at a passband, which is therefore available for carrying additional bandpass signal(s) besides low-pass baseband signal(s).

BACKGROUND OF THE INVENTION

SDM is broadly exploited in modern electronic systems, such as systems involving discrete-time digital signals sampled at a sampling frequency. Please refer to FIG. 1 illustrating a conventional spectrum arrangement for baseband signal(s) at a low-pass band. Because of many practical engineering considerations (e.g., matching an integer multiplication of a reference frequency), a sampling frequency fs of the signal(s) is usually set much higher than a Nyquist sampling frequency f_N of the signal(s). The spectrum therefore has a large vacancy, which extends from the low-pass band to an half of the sampling frequency (fs/2), not fully utilized.

SUMMARY OF THE INVENTION

An objective of the invention is providing an SDM (e.g., 120 in FIG. 2) improving spectrum efficiency of wired interconnection. The SDM may comprise a main circuit (e.g., 121) and a noise shaping circuit (e.g., 122). The main circuit may be coupled to an aggregated signal (e.g., sa1), for transferring the aggregated signal by a signal transfer function (e.g., STF(z)). The noise shaping circuit may be coupled to the main circuit, for shaping noise away from a low-pass band (e.g., LB) by a modified noise transfer function (e.g., mNTF(z)), wherein a frequency response (e.g., 126) of the modified noise transfer function has a notch (e.g., 124) at a passband (e.g., PB), and the passband may not overlap with the low-pass band.

In an embodiment, the SDM may modulate the aggregated signal to a modulated signal (e.g., sb1 in FIG. 2), and a ratio (e.g., M) dividing a sampling frequency (e.g., fs) of the modulated signal by a frequency (e.g., fP) of the passband may substantially equal a multiplication of four. In an embodiment, the frequency of the passband may substantially equal a quarter of the sampling frequency of the modulated signal.

In an embodiment, the SDM may be a multi-bit SDM modulating the aggregated signal to a modulated signal of multiple bits per sample.

In an embodiment, the frequency response of the modified noise transfer function may further have a second notch (e.g., 125) at a high-pass band (e.g., HB), and the high-pass band may not overlap with the passband and the low-pass band. In an embodiment, a frequency (e.g., fH) of the high-pass band may substantially equal a half of the sampling frequency of the modulated signal.

In an embodiment (e.g., FIG. 4), the main circuit and the noise shaping circuit may be formed by an internal circuit (e.g., 220 in FIG. 4), which may comprise a front circuit (e.g., 222), a feedback circuit (e.g., 229) and a quantizer (e.g., 226). The front circuit may be coupled to the aggregated signal, for transferring the aggregated signal and the modulated signal (e.g., sb1) respectively by a first transfer function (e.g., L1(z)) and a second transfer function (e.g., L2(z)), so as to form a first signal (e.g., x1). The feedback circuit may be coupled to the front circuit, for transferring a third signal (e.g., x3) by a third transfer function (e.g., L3(z)) to form a fourth signal (e.g., x4). The quantizer may be coupled to the front circuit and the feedback circuit, for quantizing a second signal (e.g., x2) to form the modulated signal, wherein the second signal may be a sum of the first signal and the fourth signal, the third signal may be a difference between the modulated signal and the second signal, and the notch may be formed by a modifying function (e.g., 1+L3(z)) equal to a sum of one and the third transfer function. In an embodiment, the modifying function (e.g., 1+L3(z)) may have one or more zeros at a square root of negative one.

In an embodiment, the aggregated signal may contain one or more desired signals (e.g., s1, s2) at the passband.

In an embodiment, the SDM may be included in a system (e.g., 100 in FIG. 2), and the system may further include an aggregation circuit (e.g., 110) and a transmitter (e.g., 132).

An objective of the invention is providing a system (e.g., 100 in FIG. 2) improving spectrum efficiency of wired interconnection. The system may include an aggregation circuit (e.g., 110) and a transmitter (e.g., 132). The aggregation circuit may sum one or more bandpass signals (e.g., s1 and/or s2) and a low-pass signal (e.g., D3). The transmitter may be coupled to the aggregation circuit, for transmitting, via a wired channel (e.g., 10), an interconnection signal (e.g., sb1) resulting from the aggregation circuit. The said one or more bandpass signals may be at a passband (e.g., PB), the low-pass signal may be at a low-pass band (e.g., LB); and, the passband may not overlap with the low-pass band.

In an embodiment, a frequency (e.g., fP) of the passband may substantially equal a quarter of a sampling frequency (e.g., fs) of the interconnection signal.

In an embodiment, the aggregation circuit may further implement multiplication of a first source signal (e.g., D1) and a first transmitter oscillation signal (e.g., TO1) to form a first one (e.g., s1) of said one or more bandpass signals, and may further implement multiplication of a second source signal (e.g., D2) and a second transmitter oscillation signal (e.g., TO2) to form a second one (e.g., s2) of said one or more bandpass signals, wherein a phase of the second transmitter oscillation signal may differ from a phase of the first transmitter oscillation signal.

In an embodiment, the system may further comprise a receiver (e.g., 134) and a separation circuit (e.g., 140). The receiver may be coupled to the transmitter, for receiving the interconnection signal from the transmitter to form a received signal (e.g., sc1). The separation circuit may be coupled to the receiver, may implement multiplication of the received signal and a first receiver oscillation signal (e.g., RO1) to form a first separated signal (e.g., sd1), and may further implement multiplication of the received signal and a second receiver oscillation signal (e.g., RO2) to form a second separated signal (e.g., sd2).

In an embodiment, said one or ore bandpass signals may include a first bandpass signal (e.g., s1), and the aggregation circuit may further form every four or more samples (e.g., s1[4*k] to s1[4*k+3]) of the first bandpass signal from every four or more samples (e.g., D1[4*k] to D1[4*k+3]) of a first source signal (e.g., D1) by: arranging a first one (e.g., s1[4*k]) of the four or more samples of the first bandpass signal to equal a first one (e.g., D1[4*k]) of the four or more samples of the first source signal, arranging a second one (e.g., s1[4*k+1]) of the four or more samples of the first bandpass signal to equal zero, arranging a third one (e.g., s1[4*k+2]) of the four or more samples of the first bandpass signal to equal a complement (e.g., −D1[4*k+2]) of a third one of the four or more samples of the first source signal, and arranging a fourth one (e.g., s1[4*k+3]) of the four or more samples of the first bandpass signal to equal zero.

In an embodiment, said one or ore bandpass signals may include a summed bandpass signal (e.g., ss1); and the aggregation circuit may further form every four or more samples (e.g., e.g., ss1[4*k] to ss1[4*k+3]) of the summed bandpass signal from every four or more samples (e.g., D1[4*k] to D1[4*k+3]) of a first source signal (e.g., D1) and every four or more samples (e.g., D2[4*k] to D2[4*k+3]) of a second source signal (e.g., D2) by: arranging a first one (e.g., ss1[4*k]) of the four or more samples of the summed bandpass signal to equal a first one (e.g., D1[4*k]) of the four or more samples of the first source signal, arranging a second one (e.g., ss1[4*k+1]) of the four or more samples of the summed bandpass signal to equal a second one (e.g., D2[4*k+1]) of the four or more samples of the second source signal, arranging a third one (e.g., ss1[4*k+2]) of the four or more samples of the summed bandpass signal to equal a complement (e.g., −D1[4*k+2]) of a third one of the four or more samples of the first source signal, and arranging a fourth one (e.g., ss1[4*k+3]) of the four or more samples of the summed bandpass signal to equal a complement (e.g., −D2[4*k+3]) of a fourth one of the four or more samples of the second source signal.

In an embodiment (e.g., FIG. 3), the system may further comprise a receiver (e.g., 134) and a separation circuit (e.g., 140a in FIG. 3). The receiver may be coupled to the transmitter, for receiving the interconnection signal from the transmitter to form a received signal (e.g., sc1). The separation circuit may be coupled to the receiver, for separating the received signal to a first separated signal (e.g., sd1) and a second separated signal (e.g., sd2) by; arranging every two consecutive samples of the received signal to respectively be a samples of the first separated signal and a sample of the second separated signal.

In an embodiment, the system may further comprise an SDM (e.g., 120) coupled between the aggregation circuit and the transmitter, for modulating an aggregated signal (e.g., sa1) resulting from the aggregation circuit, with noise shaped away from the low-pass band by a modified noise transfer function (e.g., mNTF(z)), so as to form the interconnection signal; wherein a frequency response (e.g., 126) of the modified noise transfer function may have a notch (e.g., 124) at the passband. In an embodiment, the frequency response of the modified noise transfer function may further have a second notch (e.g., 125 in FIG. 2) at a high-pass band (e.g., HB), and the high-pass band may not overlap with the passband and the low-pass band.

In an embodiment, a frequency (e.g., fH) of the high-pass band may substantially equal a half of the sampling frequency of the interconnection signal.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 4 illustrates an internal circuit of an SDM according to an embodiment of the invention;

FIG. 5 illustrates frequency responses of different noise transfer functions related to the SDM shown in FIG. 4.

DETAILED DESCRIPTION OF PREFERRED EMBODIMENTS

Figure 1:
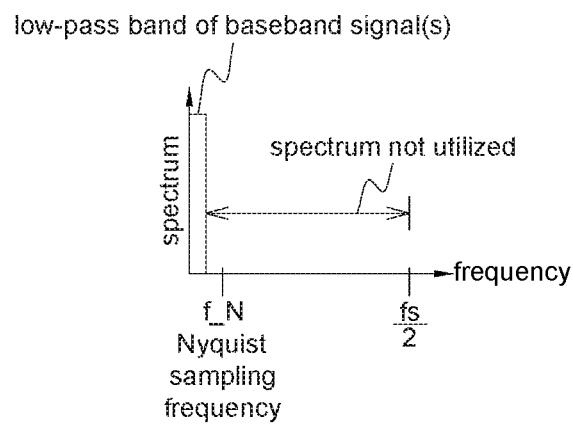
FIG. 1 (prior art) illustrates a conventional spectrum arrangement.
Figure 2:
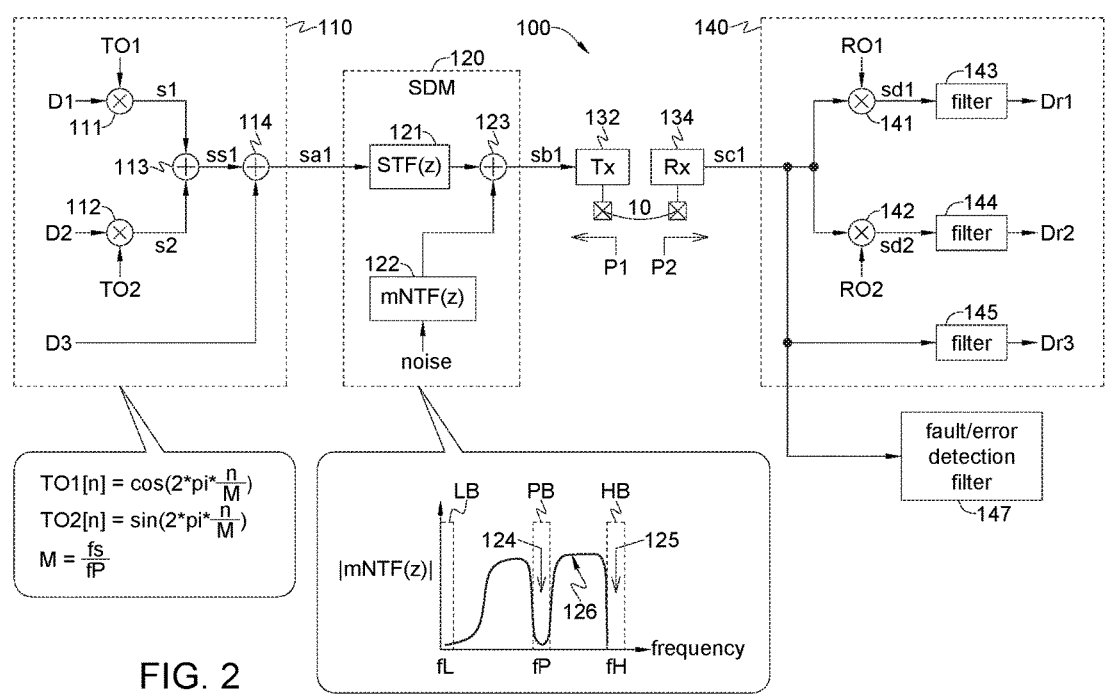
FIG. 2 illustrates a system according to an embodiment of the invention.

Please refer to FIG. 2 illustrating a system 100 according to an embodiment of the invention. The system 100 may include an aggregation circuit 110, an SDM 120, a transmitter 132, a receiver 134 and a separation circuit 140. The aggregation circuit 110 may; implement a multiplier 111 to form a bandpass signal s1 by multiplication of a source signal D1 and a transmitter oscillation signal TO1, implement a multiplier 112 to form a bandpass signal s2 by multiplication of a source signal D2 and a transmitter oscillation signal TO2, implement a sum block 113 to form a summed bandpass signal ss1 by summing the signals s1 and s2, and implement another sum block 114 to form an aggregated signal sa1 by summing the signals ss1 and another source signal D3.

The signals D1, D2 and D3 may be discrete-time digital baseband signals at a low-pass band LB, and each of the signals D1, D2 and D3 may contain desired data and/or information. Each of the signals TO1 and TO2 may be a discrete-time digital signal sampled at a sampling frequency fs. Each sample s1[$n$] of the signal s1 may be a multiplication of a sample D1 [$n$] of the signal D1 and a sample TO1 [$n$] of the signal TO1, i.e., s1 [$n$]=D1[$n$]*TO1[$n$]; each sample s2[$n$] of the signal s2 may be a multiplication of a sample D2[$n$] of the signal D2 and a sample TO2[$n$] of the signal TO2, i.e., s2[$n$]=D2[$n$]*TO2[$n$].

Each of the signals TO1 and TO2 may be periodic at a frequency fP, so the signals s1=D1*TO1 and s2=D2*TO2 may be bandpass signals at a passband PB enclosing the frequency fP. As shown in FIG. 2, the passband PB may not overlap with the low-pass band LB. By summing the low-pass signal D3 and the bandpass signals s1 and s2, the signal sa1 resulting from the aggregation circuit 110 may contain desired signals not only at the low-pass band LB, but also at the passband PB.

In an embodiment, the signals TO1 and TO2 may be sinusoidal signals of the same frequency fP, but a phase of the signal TO1 may differ from a phase of the signal TO2, e.g., by 90 degrees. For example, in an embodiment, each sample TO1[$n$] of the signal TO1 may be cos(2*pi*n/M), and each sample TO2[n] of the signal TO2 may be sin(2*pi*n/M), with M being a ratio dividing the sampling frequency fs by the frequency fP. Thus, each sample s1[n] of the signal s1 may be expressed by s1[n]=D1[n]*cos(2*pi*n/M), and each sample s2[n] of the signal s2 may be expressed by s2[n]=D2[n]*sin(2*pi*n/M). In an embodiment, the ratio M=fs/fP may be an integer multiplication of 4, i.e., M=4*M0 with M0 being a constant integer; for example, the ratio M may be set equal to 4, 8 or 12, etc.; that is, the frequency fP may be set equal to fs/4, fs/8 or fs/12, etc. With the ratio M set to be an integer multiplication of 4, the aggregation circuit 110 may form the bandpass signal ss1 by circuitry of low complexity.

For example, in an embodiment, the ratio M=fs/fP may equal 4, so every four samples TO1[4*k], TO1[4*k+1], TO1[4*k+2] and TO1[4*k+3] of the signal TO1 will respectively equal 1, 0, −1 and 0, and corresponding four samples s1[4*k], s1[4*k+1], s1[4*k+2] and s1[4*k+3] of the signal s1 will therefore equal D1[4*k], 0, −D1[4*k+2] and 0. That is, with the ratio M set equal to 4, the aggregation circuit 110 may not actually need a physical multiplying circuit for multiplying the signals D1 and TO1 to form the signal s1; the aggregation circuit 110 may form every four samples s1[4*k], s1[4*k+1], s1[4*k+2] and s1[4*k+3] of the signal s1 simply by: arranging the sample s1[4*k] of the signal s1 to equal the sample D1[4*k] of the signal D1, arranging the sample s1[4*k+1] of the signal s1 to equal zero, arranging the sample s1[4*k+2] of the signal s1 to equal a complement of the sample D1[4*k+2] of the signal D1 (i.e., s1[4*k+2]= −D1[4*k+2]), and arranging the sample s1[4*k+3] of the signal s1 to equal zero. Similarly, with M=4, every four samples TO2[4*k], TO2[4*k+1], TO2[4*k+2] and TO2[4*k+3] of the signal TO2 will respectively equal 0, 1, 0 and −1, and corresponding four samples s2[4*k], s2[4*k+1], s2[4*k+2] and s2[4*k+3] of the signal s2 will therefore equal 0, D2[4*k+1], 0, −D2[4*k+3]. Accordingly, every four sample ss1[4*k], ss1[4*k+1], ss1[4*k+2] and ss1[4*k+3] of the summed signal ss1=s1+s2 will therefore respectively equal D1[4*k], D2[4*k+1], −D1[4*k+2] and −D2[4*k+2].

Figure 3:
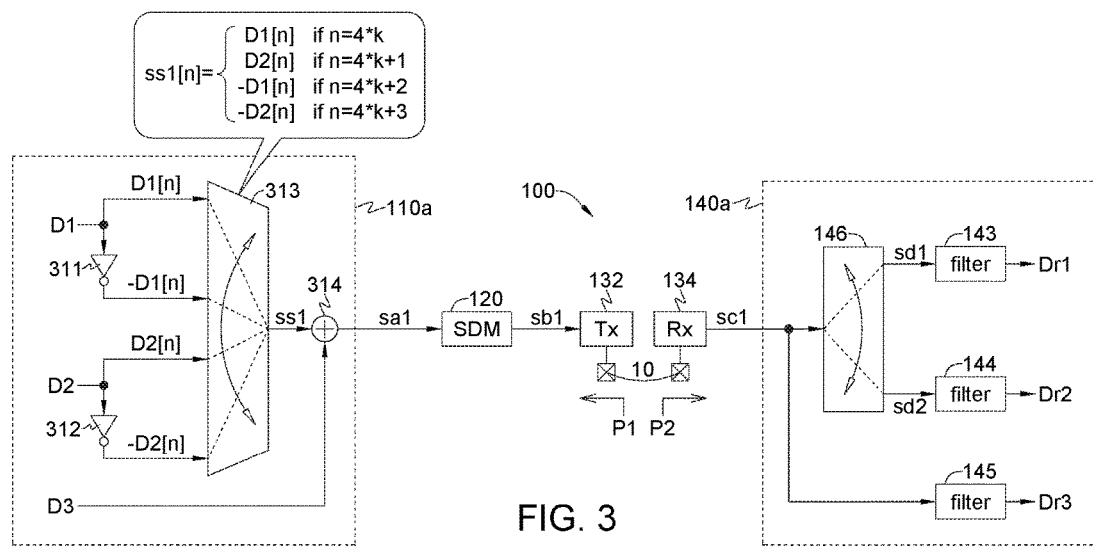
FIG. 3 illustrates a system according to an embodiment of the invention.

That is, with the ratio M=fs/fP set equal to 4 (i.e., fP=fs/4) by setting the frequency fP substantially equal to a quarter of the sampling frequency fs, the aggregation circuit 110 in FIG. 2 may be achieved by an aggregation circuit 110a shown in FIG. 3; as shown in FIG. 3, the aggregation circuit 110a may include two complement converters 311 and 312, a switch (e.g., a multiplexer) 313 and a sum block 314. The complement converter 311 may be coupled to the signal D1, for forming a complement of a sample D1[n] of the signal D1, and the complement converter 312 may be coupled to the signal D2, for forming a complement of a sample D2[n] of the signal D2. The switch 313 may be coupled to the signals D1 and D2, as well as the complement converters 311 and 312, for: selecting the sample D1[n] to be the sample ss1[n] if n=4*k, selecting the sample D2[n] to be the sample ss1[n] if n=4*k+1, selecting the complement sample −D1[n] to be the sample ss1[n] if n=4*k+2, and selecting the complement sample −D2[n] to be the sample ss1[n] if n=4*k+3. In other words, the aggregation circuit 110a may form every four samples ss1[4*k], ss1[4*k+1], ss1[4*k+2] and ss1[4*k+3] of the signal ss1 by: arranging the sample ss1[4*k] of the signal ss1 to equal the sample D1[4*k] of the signal D1, arranging the sample ss1[4*k+1] of the signal ss1 to equal the sample D2[4*k 1] of the signal D2, arranging the sample ss1[4*k+2] of the signal ss1 to equal a complement of the sample D1[4*k+2] of the signal D1, and arranging the sample ss1[4*k 3] of the signal ss1 to equal a complement of the sample D2[4*k+3] of the signal D2. The sum block 314 may sum the signals ss1 and D3 to calculate the signal sa1. It is therefore noted that, with the ratio M set equal to 4, multiplying operations involved in calculating the signal ss1=D1*TO1+D2*TO2 may be eliminated, and the multipliers 111, 112 and the sum block 113 in the aggregation circuit 110 (FIG. 2) may be simplified to the complement converters 311, 312 and the switch 313 in the aggregation circuit 110a (FIG. 3).

In an embodiment with the ratio M=fs/fP set equal to 8 (i.e., fP=fs/8), the aggregation circuit 110 (FIG. 2) may form every eight samples ss1[8*k] to ss1[8*k+7] of the signal ss1 by: arranging the sample ss1[8*k] to equal the sample D1[8*k] of the signal D1, arranging the sample ss1[8*k+1] to equal c0*(D1[8*k+1]+D2[8*k+1]), arranging the sample ss1[8*k+2] to equal the sample D2[8*k+2] of the signal D2, arranging the sample ss1[8*k+3] to equal c0*(−D1[8*k+3]+D2[8*k+3]), arranging the sample ss1[8*k+4] to equal a complement of the sample D1[8*k+4] (i.e., −D1[8*k+4]), arranging the sample ss1[8*k+5] to equal c0*(−D1[8*k+5]−D2[8*k+5]), arranging the sample ss1[8*k+6] to equal a complement of the sample D2[8*k+6] (i.e., −D2[8*k+6]), and arranging the sample ss1[8*k+7] to equal c0*(D1[8*k+7]−D2[8*k+7]), wherein the term c0 is a constant equal to a half of a square root of 2. It is therefore noted that, with the ratio M set to 8, multiplying operations involved in calculating the signal ss1=D1*TO1+D2*TO2 may be simplified to a multiplication of the constant c0, and thus circuitry complexity of the aggregation circuit 110 may be reduced.

In the system 100 shown in FIG. 2, the SDM 120 may be coupled between the aggregated circuit 110 and the transmitter 132, and may modulate the signal sa1 to a modulated signal sb1 with noise shaping. In an embodiment, modulation of the SDM 120 may reduce bit number per sample and/or throughput, e.g., the SDM 120 may modulate the signal sa1 of more bits per sample and/or higher throughput to the signal sb1 of fewer bits per sample and/or lower throughput.

As shown in FIG. 2, the SDM 120 may include a main circuit 121, a noise shaping circuit 122 and a sum block 123. The main circuit 121 may transfer the signal sa1 by a signal transfer function STF(z) (with respect to z-transform). The noise shaping circuit 122 may be coupled to the sum block 123, for shaping noise away from the low-pass band LB by a modified noise transfer function mNTF(z). The sum block 123 may be coupled to the main circuit 121 and the noise shaping circuit 122, and may provide the signal sb1 by summing transferred results of the main circuit 121 and the noise shaping circuit 122. Operation of the SDM 120 may therefore be expressed as Sb1(z)=STF(z)*Sa1(z)+mNTF(z)*Q(z), with Sa1(z) and Sb1(z) denoting z-transform of the signals sa1 and sb1, and Q(z) denoting noise. As shown in FIG. 2, a frequency response 126 of the modified noise transfer function mNTF(z) may have a notch 124 at the passband PB. Because of the notch 124 at the passband PB, the SDM 120 will not shape noise into the passband PB, and may then improve spectrum efficiency by enabling the passband PB to be utilized by the desired bandpass signals s1 and s2.

In an embodiment, as shown in FIG. 2, the frequency response 126 of the modified noise transfer function mNTF(z) may further have a second notch 125 at a high-pass band HB, and the high-pass band HB may not overlap with the passband PB and the low-pass band LB; a frequency fH of the band HB may be higher than the frequency fP of the passband PB, and the frequency fP may be higher than a frequency fL of the band LB. In an embodiment, the frequency fH of the high-pass band HB may substantially equals a half of the sampling frequency fs. Because of the notch 125, the SDM 120 will not shape noise into the band HB. The cleared band HB may be utilized to facilitate detection and/or correction of fault/error.

In the SDM 120, the main circuit 121, the noise shaping circuit 122 and the sum block 123 may be formed by an internal circuit 220 shown in FIG. 4. As shown in FIG. 4, the internal circuit 220 may include a front circuit 222, a feedback circuit 229, a quantizer 226 and sum blocks 228 and 224. The front circuit 222 may be coupled to the signals sa1 and sb1, for transferring the signal sa1 and the signal sb1 respectively by a first transfer function $L1(z)$ and a second transfer function $-L2(z)$, so as to form a first signal x1. The feedback circuit 229 may be coupled to the main circuit 222 via the sum block 224, for transferring a third signal x3 by a third transfer function $L3(z)$ to form a fourth signal x4. The quantizer 226 may be coupled to the front circuit 222 and the feedback circuit 229, for quantizing a second signal x2 to form the signal sb1. By the sum blocks 224 and 228, the signal x1 may be a sum of the signal x1 and the signal x4, the signal x3 may be a difference between the signal sb1 and the signal x2. In an embodiment, the SDM 120 in FIG. 2 may be a multi-bit SDM which may modulate the sa1 signal to the signal sb1 of multiple bits per sample; i.e., the quantizer 226 in FIG. 4 may be a multi-bit quantizer.

Operation of the internal circuit 220 may be expressed as $Sb1(z)=L1(z)*Sa1(z)/(1+L2(z))+(1+L3(z))*Q(z)$, thus the signal transfer function $STF(z)$ may equal $L1(z)/(1+L2(z))$, and the modified noise transfer function $mNTF(z)$ may equal $(1+L3(z))/(1+L2(z))$. With $1/(L2(z))$ being an intrinsic noise transfer function $iNTF(z)$, the modified noise transfer function $mNTF(z)$ may be expressed as $(1+L3(z))*iNTF(z)$. As shown in FIG. 5, a frequency response 226 of the intrinsic noise transfer function $iNTF(z)$ may be configured to shape noise away from the band LB to other bands, including the bands PB and HB. On the other hand, as previously described, the frequency response 226 of the intrinsic noise transfer function $mNTF(z)$ may be configured to have the notch 124 at the passband PB, and have the notch 125 at the band HB, so noise will not be shaped to the bands PB and HB. The notches 124 and 125 may be formed by a modifying function $(1+L3(z))$ equal to a sum of one and the transfer function $L3(z)$, since the modified transfer function $mNTF(z)$ may be a product of the intrinsic noise transfer function $iNTF(z)$ and the modifying function $(1+L3(z))$. For example, in an embodiment, the modifying function $(1+L3(z))$ may include a factor $(1+z\char`\^(-2))$ to have one or more zeros at a square root of $-1$, so as to form the notch 124 at the frequency fP=fs/4. In an embodiment, the modifying function $(1+L3(z))$ may have one or more zeros at $-1$, so as to form the notch 125 at the frequency fH=fs/2.

In the system 100 shown in FIG. 2, the modulated signal sb1 from the SDM 120 may be an interconnection signal of wired interconnection; the transmitter 132 may be coupled to a cascade of the aggregation circuit 110 and the SDM 120, and may transmit the signal sb1 to the receiver 134 via a wired channel 10 (e.g., SerDes channel) between two semiconductor chips (dice). That is, the system 100 may include two portions P1 and P2 respectively formed on two semiconductor chips; the portion P1 may include the aggregation circuit 110, the SEM 120 and the transmitter 132, and the portion P2 may include the receiver 134 and the separation circuit 140. The receiver 134 may be coupled to the transmitter 132 via the wired channel 10, for receiving the signal sb1 from the transmitter 134 to form a signal sc1. In an embodiment, the transmitter 132 may be a digital physical layer circuit, for packaging samples of the signal sb1 to packets, and transmitting the packets to the receiver 134; the receiver 134 may be another digital physical layer circuit, for receiving the packets sent by the transmitter 132, and unpacking samples from the packets to form samples of the signal sc1.

The separation circuit 140 may be coupled to the receiver 134, and may include multipliers 141 and 142, along with filters 143, 144 and 145. The multiplier 141 may be coupled to the signal sc1 and a receiver oscillation signal RO1, for implementing multiplication of the signals sc1 and RO1 to form a first separated signal sd1. The multiplier 142 may be coupled to the signal sc2 and another receiver oscillation signal RO2, for implementing multiplication of the signals sc1 and RO2 to form a second separated signal sd2. In an embodiment, similar to the signals TO1 and TO2, the signals RO1 and RO2 may be periodic at the same frequency fP, but have different phases. The filter 143 may be coupled to the multiplier 141 for filtering the signals sd1 to form a low-pass baseband signal Dr1, so the signal D1 of the portion P1 may be received as the signal Dr1 at the portion P2. The filter 144 may be coupled to the multiplier 142, for filtering the signals sd2 to form a low-pass baseband signal Dr2, so the signal D2 of the portion P1 may be received as the signal D21 at the portion P2. The filter 145 may be coupled to the receiver 134, for filtering the signals sd1 to form a low-pass baseband signal Dr3, so the signal D3 of the portion P1 may be received as the signal Dr3 at the portion P2. In an embodiment, the filters 143, 144 and 145 may be CIC (cascaded integrator-comb) filters.

As previously described, by setting the frequency fP substantially equal to a quarter of the sampling frequency fs, the ratio M=fs/fP may equal 4, and the aggregation circuit 110 in FIG. 2 may be simplified to the aggregation circuit 110a in FIG. 3; similarly, the separation circuit 140 in FIG. 2 may be simplified to a separation circuit 140a in FIG. 3. As shown in FIG. 3, the multipliers 141 and 142 in FIG. 2 may be simplified to a switch 146 coupled between the receiver 134 and the filters 143 and 144, for selecting a sample sc1[2*n] of the signal sc1 to form a sample sd1[n] of the signal sd1, and selecting a sample sc1[2*n+1] of the signal sc1 to form a sample sd2[n] of the signal sd2. That is, the switch 146 may arrange every two consecutive samples sc1[2*n] and sc1[2*n+1] of the received signal sc1 to respectively be the samples sd1[n] of the signal sd1 and the sample sd2[n] of the signal sd2.

Figure 6:
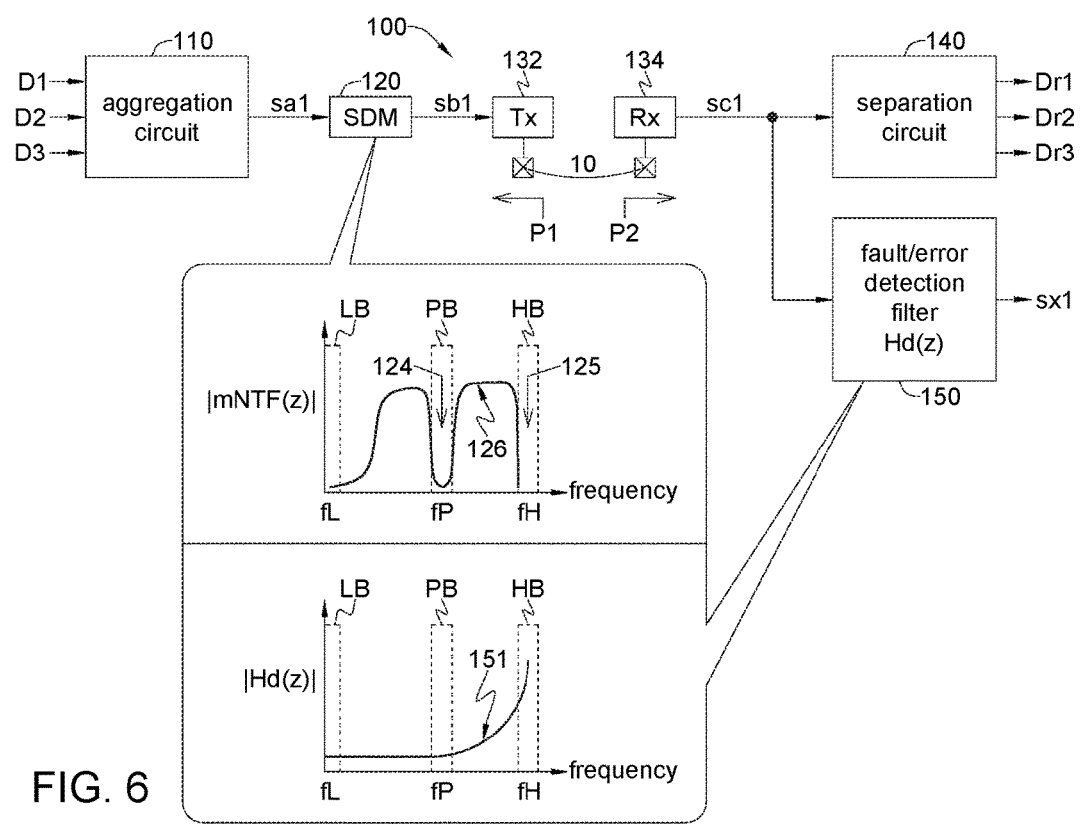
FIG. 6 illustrates a system according to an embodiment of the invention.

As previously described, the modified noise transfer function mNTF(z) of the SDM 120 may keep signal sb1 cleared from noise at the band HB, so as to facilitate detection/correction of fault/error. When the signal sb1 is transmitted from the portions P1 to P2 to form the signal sc1, if fault/error occurs during the transmission, the fault/error will contribute nonzero component to the band HB, so the signal sc1 will not be emptied at the band HB. Thus, whether the signal sc1 is emptied at the band HB may be utilized to indicate whether fault/error occurs. For example, in an embodiment shown in FIG. 6, the system 100 may further include a fault/error detection filter 150 coupled to the receiver 134 in parallel with the separation circuit 140, for filtering the signal sc1 to form a detection signal sx1 by a transfer function Hd(z), and a frequency response 151 of the transfer function Hd(z) may have a peak at the band HB. If fault/error occurs during the transmission and therefore contributes nonzero component to the band HB, the nonzero component at the band HB will be enhanced by the transfer function Hd(z), and the signal sd1 will saturate to bound(s) of a predefined signal range. By checking if the signal sd1 saturates, the system 100 may detect whether fault/error occurs. In an embodiment, the transfer function $H_d(z)$ may have one or more poles at −1 to form the peak at the frequency $f_H=f_s/2$; for example, in an embodiment, the transfer function $H_d(z)$ may equal $c1/(1+z^{\wedge}(-1))$, with $c1$ being a constant.

To sum up, by fully utilizing passband which is vacant due to oversampling, the system of the invention may aggregate multiple baseband data streams (e.g., the signals D1 to D3) into a single signal stream (e.g., the signal sa1) for wired interconnection, and the SDM in the system of the invention may avoid shaping noise to the passband, so as to support the aggregation. The system of the invention may therefore improve spectrum efficiency of wired interconnection.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A sigma-delta modulator (SDM) improving spectrum efficiency of wired interconnection, comprising:
   a main circuit for transferring an aggregated signal by a signal transfer function; and
   a noise shaping circuit coupled to the main circuit, for shaping noise away from a low-pass band by a modified noise transfer function;
   wherein a frequency response of the modified noise transfer function has a notch at a passband, and the passband does not overlap with the low-pass band; and
   wherein the SDM modulates the aggregated signal to a modulated signal, and a ratio dividing a sampling frequency of the modulated signal by a frequency of the passband substantially equals a multiplication of four.

2. A sigma-delta modulator (SDM) improving spectrum efficiency of wired interconnection, comprising:
   a main circuit for transferring an aggregated signal by a signal transfer function; and
   a noise shaping circuit coupled to the main circuit, for shaping noise away from a low-pass band by a modified noise transfer function;
   wherein a frequency response of the modified noise transfer function has a notch at a passband, and the passband does not overlap with the low-pass band; and
   wherein the SDM modulates the aggregated signal to a modulated signal, and a frequency of the passband substantially equals a quarter of a sampling frequency of the modulated signal.

3. A sigma-delta modulator (SDM) improving spectrum efficiency of wired interconnection, comprising:
   a main circuit for transferring an aggregated signal by a signal transfer function; and
   a noise shaping circuit coupled to the main circuit, for shaping noise away from a low-pass band by a modified noise transfer function;
   wherein a frequency response of the modified noise transfer function has a notch at a passband, and the passband does not overlap with the low-pass band; and
   the SDM is a multi-bit SDM modulating the aggregated signal to a modulated signal of multiple bits per sample.

4. A sigma-delta modulator (SDM) improving spectrum efficiency of wired interconnection, comprising:
   a main circuit for transferring an aggregated signal by a signal transfer function; and
   a noise shaping circuit coupled to the main circuit, for shaping noise away from a low-pass band by a modified noise transfer function;
   wherein a frequency response of the modified noise transfer function has a notch at a passband, and the passband does not overlap with the low-pass band; and
   wherein the frequency response of the modified noise transfer function further has a second notch at a high-pass band, and the high-pass band does not overlap with the passband and the low-pass band.

5. The SDM of claim 4, wherein the SDM modulates the aggregated signal to a modulated signal, and a frequency of the high-pass band substantially equals a half of a sampling frequency of the modulated signal.

6. A sigma-delta modulator (SDM) improving spectrum efficiency of wired interconnection, comprising:
   a main circuit for transferring an aggregated signal by a signal transfer function; and
   a noise shaping circuit coupled to the main circuit, for shaping noise away from a low-pass band by a modified noise transfer function;
   wherein a frequency response of the modified noise transfer function has a notch at a passband, and the passband does not overlap with the low-pass band; and
   wherein the main circuit and the noise shaping circuit are formed by an internal circuit which comprises:
   a front circuit for transferring the aggregated signal and a modulated signal respectively by a first transfer function and a second transfer function, so as to form a first signal;
   a feedback circuit coupled to the front circuit, for transferring a third signal by a third transfer function to form a fourth signal; and
   a quantizer coupled to the front circuit and the feedback circuit, for quantizing a second signal to form the modulated signal;
   wherein the second signal is a sum of the first signal and the fourth signal, the third signal is a difference between the modulated signal and the second signal, and
   the notch is formed by a modifying function equal to a sum of one and the third transfer function.

7. The SDM of claim 6, wherein the modifying function has one or more zeros at a square root of negative one.

8. A sigma-delta modulator (SDM) improving spectrum efficiency of wired interconnection, comprising:
   a main circuit for transferring an aggregated signal by a signal transfer function; and
   a noise shaping circuit coupled to the main circuit, for shaping noise away from a low-pass band by a modified noise transfer function;
   wherein a frequency response of the modified noise transfer function has a notch at a passband, and the passband does not overlap with the low-pass band; and
   wherein the aggregated signal contains one or more desired signals at the passband.

9. A system improving spectrum efficiency of wired interconnection, comprising:
   an aggregation circuit summing one or more bandpass signals and a low-pass signal; and
   a transmitter coupled to the aggregation circuit, for transmitting, via a wired channel, an interconnection signal resulting from the aggregation circuit;

wherein said one or more bandpass signals are at a passband, the low-pass signal is at a low-pass band; and, the passband does not overlap with the low-pass band.

10. The system of claim 9, wherein a frequency of the passband substantially equals a quarter of a sampling frequency of the interconnection signal.

11. The system of claim 9, wherein:
the aggregation circuit further implements multiplication of a first source signal and a first transmitter oscillation signal to form a first one of said one or more bandpass signals, and further implements multiplication of a second source signal and a second transmitter oscillation signal to form a second one of said one or more bandpass signals; and
a phase of the second transmitter oscillation signal differs from a phase of the first transmitter oscillation signal.

12. The system of claim 9 further comprising:
a receiver coupled to the transmitter, for receiving the interconnection signal from the transmitter to form a received signal; and
a separation circuit coupled to the receiver, implementing multiplication of the received signal and a first receiver oscillation signal to form a first separated signal, and further implementing multiplication of the received signal and a second receiver oscillation signal to form a second separated signal.

13. The system of claim 9, wherein:
said one or more bandpass signals includes a first bandpass signal; and
the aggregation circuit further forms every four or more samples of the first bandpass signal from every four or more samples of a first source signal by:
arranging a first one of the four or more samples of the first bandpass signal to equal a first one of the four or more samples of the first source signal;
arranging a second one of the four or more samples of the first bandpass signal to equal zero;
arranging a third one of the four or more samples of the first bandpass signal to equal a complement of a third one of the four or more samples of the first source signal; and
arranging a fourth one of the four or more samples of the first bandpass signal to equal zero.

14. The system of claim 9, wherein:
said one or more bandpass signals includes a summed bandpass signal; and
the aggregation circuit further forms every four or more samples of the summed bandpass signal from every four or more samples of a first source signal and every four or more samples of a second source signal by:
arranging a first one of the four or more samples of the summed bandpass signal to equal a first one of the four or more samples of the first source signal;
arranging a second one of the four or more samples of the summed bandpass signal to equal a second one of the four or more samples of the second source signal;
arranging a third one of the four or more samples of the summed bandpass signal to equal a complement of a third one of the four or more samples of the first source signal; and
arranging a fourth one of the four or more samples of the summed bandpass signal to equal a complement of a fourth one of the four or more samples of the second source signal.

15. The system of claim 9 further comprising:
a receiver coupled to the transmitter, for receiving the interconnection signal from the transmitter to form a received signal; and
a separation circuit coupled to the receiver, for separating the received signal to a first separated signal and a second separated signal by:
arranging every two consecutive samples of the received signal to respectively be a samples of the first separated signal and a sample of the second separated signal.

16. The system of claim 9 further comprising:
an SDM coupled between the aggregation circuit and the transmitter, for modulating an aggregated signal resulting from the aggregation circuit, with noise shaped away from the low-pass band by a modified noise transfer function, so as to form the interconnection signal;
wherein a frequency response of the modified noise transfer function has a notch at the passband.

17. The system of claim 16, wherein the frequency response of the modified noise transfer function further has a second notch at a high-pass band, and the high-pass band does not overlap with the passband and the low-pass band.

18. The system of claim 17, wherein a frequency of the high-pass band substantially equals a half of the sampling frequency of the interconnection signal.

19. The system of claim 16, wherein the SDM comprises:
a front circuit for transferring the aggregated signal and the interconnection signal respectively by a first transfer function and a second transfer function, so as to form a first signal;
a feedback circuit coupled to the front circuit, for transferring a third signal by a third transfer function to form a fourth signal; and
a quantizer coupled to the front circuit and the feedback circuit, for quantizing a second signal to form the interconnection signal;
wherein the second signal is a sum of the first signal and the fourth signal, the third signal is a difference between the interconnection signal and the second signal, and
the notch is formed by a modifying function equal to a sum of one and the third transfer function.

* * * * *